US006549042B2

(12) United States Patent
Proebsting (10) Patent No.: US 6,549,042 B2
(45) Date of Patent: Apr. 15, 2003

(54) COMPLEMENTARY DATA LINE DRIVER CIRCUITS WITH CONDITIONAL CHARGE RECYCLING CAPABILITY THAT MAY BE USED IN RANDOM ACCESS AND CONTENT ADDRESSABLE MEMORY DEVICES AND METHOD OF OPERATING SAME

(75) Inventor: Robert J. Proebsting, Morgan Hill, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/004,456

(22) Filed: Oct. 19, 2001

(65) Prior Publication Data

US 2002/0079942 A1 Jun. 27, 2002

Related U.S. Application Data

(63) Continuation-in-part of application No. 09/602,330, filed on Jun. 23, 2000, now Pat. No. 6,307,417.

(51) Int. Cl.$^7$ ................................................ H03F 3/45
(52) U.S. Cl. ............................ 327/51; 327/57; 365/205
(58) Field of Search ............................... 327/51, 52, 55, 327/57, 59, 64, 65; 345/419; 328/98; 365/203, 205, 207

(56) References Cited

U.S. PATENT DOCUMENTS

| | | | |
|---|---|---|---|
| 4,122,361 A | 10/1978 | Clemen et al. ............... 307/208 |
| 4,397,003 A | 8/1983 | Wilson et al. | |
| 4,618,788 A | 10/1986 | Backes et al. ............... 307/603 |
| 4,651,270 A | 3/1987 | Edwards ....................... 363/96 |
| 4,723,108 A | 2/1988 | Murphy et al. ............... 323/315 |
| 4,894,621 A | 1/1990 | Koenig et al. ............... 330/251 |
| 4,914,326 A | 4/1990 | Kikuda et al. ............... 307/605 |
| 5,051,630 A | 9/1991 | Kogan et al. ............... 307/603 |
| 5,057,722 A | 10/1991 | Kobotake ..................... 307/605 |
| 5,068,553 A | 11/1991 | Love .......................... 307/605 |
| 5,424,656 A | 6/1995 | Gibson et al. ................. 326/63 |
| 5,598,111 A | 1/1997 | Enomoto ....................... 326/83 |
| 5,610,546 A | 3/1997 | Carbou et al. ............... 327/261 |
| 5,767,719 A | 6/1998 | Furuchi et al. ............. 327/281 |
| 5,793,238 A | 8/1998 | Baker ......................... 327/262 |
| 5,801,567 A | 9/1998 | Kosiec ........................ 327/263 |
| 5,815,009 A | 9/1998 | Iadanza et al. ................ 327/5 |
| 5,917,289 A | 6/1999 | Merone et al. ......... 315/209 R |
| 5,920,221 A | 7/1999 | Shen et al. .................. 327/264 |
| 5,929,692 A | 7/1999 | Carsten ....................... 327/531 |
| 5,982,214 A | 11/1999 | Kim ............................ 327/280 |
| 6,002,270 A * | 12/1999 | Timoc ......................... 326/98 |
| 6,215,497 B1 * | 4/2001 | Leung ......................... 345/419 |
| 6,262,907 B1 | 7/2001 | Lien et al. | |

OTHER PUBLICATIONS

Xie et al., "An Approach for Fabricating High–Performance Inductors on Low–Resistivity Substrates," IEEE Journal of Solid–State Circuits, vol. 33, No. 9, Sep. 1998, pp. 1433–1438.

* cited by examiner

Primary Examiner—Tuan T. Lam
Assistant Examiner—Hiep Nguyen
(74) Attorney, Agent, or Firm—Myers Bigel Sibley & Sajovec (57) ABSTRACT

Complementary data line driver circuits conserve power by evaluating data on complementary data lines and providing conditional charge recycling in the event the new data to be provided to the complementary data lines differs from the old data residing thereon. These devices and circuits include first and second data lines within a complementary data line pair and a driver control circuit that is electrically coupled to the data line pair. The driver control circuit compares the old data on the data line pair against new data to be provided to the data line pair. Based on the comparison and determination that the old data is opposite the new data, the driver control circuit switches the old data to the new data in two steps. The first of the two steps includes transferring charge from the more positively biased one of the first and second data lines to the other data line in the data line pair, preferably for a duration sufficient to substantially equilibrate voltages on the first and second data lines.

46 Claims, 6 Drawing Sheets

COMPLEMENTARY DATA LINE DRIVER CIRCUITS WITH CONDITIONAL CHARGE RECYCLING CAPABILITY THAT MAY BE USED IN RANDOM ACCESS AND CONTENT ADDRESSABLE MEMORY DEVICES AND METHOD OF OPERATING SAME

CROSS-REFERENCE TO RELATED APPLICATION

This application is a continuation-in-part of U.S. application Ser. No. 09/602,330, filed Jun. 23, 2000, now U.S. Pat. No. 6,307,417, the disclosure of which is hereby incorporated herein by reference.

FIELD OF THE INVENTION

The present invention relates to integrated circuit devices and, more particularly, to methods and apparatus for saving power in digital integrated circuits when driving complementary data lines.

BACKGROUND OF THE INVENTION

Many digital integrated circuit devices include pairs of complementary data lines that provide differential digital data signals to and from circuits and devices therein. In integrated circuit memory devices, these complementary data lines may take the form of a plurality of pairs of complementary bit lines (e.g., BIT, /BIT) that are electrically coupled to respective columns of memory cells within a memory cell array. Conventional techniques for switching data signals on pairs of complementary bit lines typically include using complementary drivers to actively pull one of the bit lines within a pair up from a logic 0 voltage to a full logic 1 voltage while simultaneously pulling the other bit line within the pair down from a logic 1 voltage to a logic 0 voltage. If the switching losses associated with the complementary drivers are ignored, then each switching event that causes BIT to switch low-to-high and /BIT to switch high-to-low, or vice versa, typically draws a charge of $C(\Delta V_{BIT})$ coulombs from the power supply, where C represents the capacitance of a bit line and $\Delta V_{BIT}$ (or $\Delta V_{/BIT}$) represents the voltage swing associated with pulling the true or complementary bit line from a logic 0 voltage to a logic 1 voltage. Assuming $\Delta V_{BIT}$ equals a power supply potential of Vdd, then the expression for charge required can be simplified to CVdd coulombs for each high-to-low and low-to-high switching event pair. A different expression may apply in the event the logic 0 voltage and the logic 1 voltage do not equal 0 volts and Vdd, respectively.

However, for many applications requiring reduced power consumption, including those having battery powered supplies and those in which total power consumption requires special heat dissipating packaging, the energy associated with drawing this charge from the power supply per switching event for each pair of data lines undergoing a data change is excessive. Accordingly, integrated circuit devices that can provide a full voltage swing across complementary data lines and have reduced power consumption requirements are desirable.

SUMMARY OF THE INVENTION

Memory devices and complementary data line driver circuits according to embodiments of the present invention conserve power by evaluating old data on complementary data lines and providing conditional charge recycling in the event the new data to be provided to the complementary data lines differs from the old data residing thereon. One preferred embodiment of a data line driver circuit includes first and second data lines within a complementary data line pair and a driver control circuit that is electrically coupled to the data line pair. The driver control circuit compares the old data on the data line pair to new data to be provided to the data line pair. Based on the comparison and a determination that the old data is opposite the new data, the driver control circuit switches the old data to the new data by first transferring charge from the more positively biased one of the first and second data lines to the other data line in the data line pair. The more positively biased one of the first and second data lines may initially be at a logic 1 voltage (e.g., Vdd) and the other data line in the pair may initially be at a logic 0 voltage (e.g., GND). After the charge transfer, both are approximately at ½ Vdd. In this manner, at least a portion of the total charge required to pull a data line from a logic 0 voltage to a logic 1 voltage (complementary data line from a logic 1 voltage to a logic 0 voltage) may be provided by an already charged (discharged) complementary data line (true data line), prior to actively pulling the data line high (complementary data line) low to complete the switching process.

According to a preferred aspect of this embodiment, the charge is transferred for a sufficient duration to substantially equilibrate voltages on the first and second data lines. In particular, if the first and second data lines are biased at Vdd and GND, respectively, the duration of the charge transfer may be sufficient to establish respective voltages in a neighborhood of about ½ Vdd on the first and second data lines. The first and second data lines are then driven with the new data at the completion of the power saving charge transfer. Alternatively, if the comparison results in a determination that the old data and the new data are the same, then the driver control circuit drives the first and second data lines with the old data and then the new data without interruption and without wasting power by transferring charge unnecessarily from the more positively biased one of the first and second data lines (retaining the old data) to the other data line in the data line pair.

According to another embodiment of the present invention, the driver control circuit may include a equalization transistor having a first current carrying terminal electrically coupled to the first data line and a second current carrying terminal electrically coupled to the second data line. This equalization transistor can provide a direct charge transfer path between the first and second data lines. The driver control circuit drives a gate of the equalization transistor with a turn-on voltage when charge is to be transferred and thereby recycled from one data line to the other in the pair. The driver control circuit may also include a latch that retains the old data while charge is being transferred from the more positively biased one of the first and second data lines. The driver control circuit may evaluate the old data retained by the latch against the new data when determining whether to initiate and continue charge transfer between the data lines. The old data on the latch is replaced with the new data only after the charge transfer process (if. required) is substantially complete. In particular, the operation of driving the first and second data lines from the midpoint to full rail-to-rail signal levels with the new data may be performed in-sync with switching the old data retained by the latch to the new data.

According to still a further aspect of this embodiment, the driver control circuit may include a true data line driver having a first output electrically connected to the first data line and a PMOS pull-up transistor therein. The PMOS pull-up transistor may have a drain electrically connected to the first output, a source electrically connected to a positive power supply line and a gate that receives a first active low signal equal to DATAINB+QB, where DATAIN and DATAINB are complementary signals that represent the new data, Q and QB are complementary signals that represent the old data retained by the latch, and "+" designates an OR operator. Accordingly, the PMOS pull-up transistor associated with the true data line driver will only be conductive (requiring the PMOS gate to be low) if the new data DATAIN=1 and the old data Q=1. A complementary data line driver is also provided that has a second output electrically connected to the second data line and a PMOS pull-up transistor having a drain electrically connected to the second output, a source electrically connected to the power supply line and a gate that receives a second signal equal to DATAIN+Q. Accordingly, the PMOS pull-up transistor associated with the complementary data line driver will only be conductive if the new data DATAIN=0 and the old data Q=0.

The true data line driver also includes a NMOS pull-down transistor having a drain electrically connected to the first output, a source electrically connected to a ground reference line and a gate that receives a signal equal to DATABIN× QB, where "x" designates an AND operator. Similarly, the complementary data line driver includes an NMOS pull-down transistor having a drain electrically connected to the second output, a source electrically connected to the ground reference line and a gate that receives a second signal equal to DATAIN×Q. The driver control circuit is also configured to provide the gate of an NMOS equalization transistor with a signal equal to (DATAIN⊕Q), where "⊕" designates an exclusive OR operator.

According to another embodiment of the present invention, a preferred data line driver circuit includes first and second data lines within a complementary data line pair and a driver control circuit that is electrically coupled to the data line pair and performs a comparison of old data on the data line pair to new data to be provided to the data line pair. Based on this comparison and a determination that the old data is opposite the new data, the driver control circuit switches the old data to the new data by first transferring a quantity of charge Q that is greater than about $0.15CV_{data}$ from a more positively biased one of the first and second data lines to the other data line in the data line pair, where C is a capacitance of the more positively biased one of the first and second data lines and $V_{data}$ is a voltage of the more positively biased one of the first and second data lines relative to the other one the first and second data lines at a commencement of transferring the charge Q. More preferably, the duration of the charge transfer is sufficient to transfer enough charge Q that the voltages on the first and second data lines are equilibrated to within about $0.2V_{data}$.

According to still another embodiment of the present invention, an integrated circuit memory device includes an N×M array of data storage cells arranged as N rows of data storage cells and M columns of data storage cells. These storage cells may include, but are not limited to, memory cells such as static random access memory (SRAM) cells and content addressable memory (CAM) cells. A plurality of pairs of complementary data lines (e.g., BIT, /BIT and DATA, /DATA in a CAM) are electrically coupled to the columns of data storage cells and an integrated data line driver control circuit is electrically coupled to the plurality of pairs of complementary data lines. Many of the following examples will assume that data lines are used as bit lines in a memory device, whether they be global data lines or data lines in a CAM containing the data to be located, for example. The integrated bit line driver control circuit includes a plurality of bit line driver control cells, with each cell being electrically coupled to first and second bit lines within one of the plurality of pairs of complementary bit lines. A bit line driver control cell performs a comparison of old data on the first and second bit lines and new data to be provided to the first and second bit lines. Based on that comparison and a determination that the new data is opposite the old data, the bit line driver control cell first transfers charge from a more positively biased one of the first and second bit lines to the other bit line in the bit line pair and then, after a sufficient amount of charge has been transferred and recycled, terminates the charge transfer between the bit lines and actively drives the first and second bit lines with the new data. A sufficient amount of charge is preferably that amount of charge necessary to substantially equilibrate voltages on the first and second bit lines.

Still further embodiments of the present invention include methods of operating integrated circuit memory devices by driving first and second bit lines within a complementary bit line pair with first data that causes the first bit line to become more positively biased than the second bit line, during a first time interval. Then, upon application of second new data that is opposite the first data, the first and second bit lines are driven with new data in two steps, first by transferring charge from the first bit line to the second bit line during a leading portion of a second time interval that commences upon termination of the first time interval. This charge transfer may be enabled by turning on an equalization transistor having first and second current carrying terminals that are electrically connected to the first and second bit lines. Then, after charge transferring is substantially complete (i.e., the voltages of the complementary bit lines are nearly equal), the charge transfer path is disabled after which the complementary bit lines are driven to their full logic levels.

In the above method, the step of driving the first and second bit lines with second opposite data includes turning on the equalization transistor and transferring charge from the first bit line to the second bit line during the leading portion of the second time interval while the outputs of the first and second bit line driver devices are maintained in high-impedance states. Then, upon completion of the charge transfer, the equalization transistor is turned off and the first and second bit lines are driven with the new data by pulling down the first bit line with the first bit line driver and pulling up the second bit line with the second bit line driver during a trailing portion of the second time interval. Although less preferred from a power savings standpoints, the first and second bit line drivers may be active during the leading portion of the second time interval.

DESCRIPTION OF PREFERRED EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be through and complete, and will fully convey the scope of the invention to those skilled in the art. Like reference numerals refer to like elements throughout and signal lines and signals thereon may be referred to by the same reference characters. Moreover, the voltages and signal levels described herein assume a ground reference level of zero (0) Volts, however, as will be understood by those skilled in the art, nonzero reference voltage levels may be used and treated as a "ground" reference level and the voltage and signal levels described herein may be adjusted to account for these non-zero reference voltage levels.

Figure 1A:
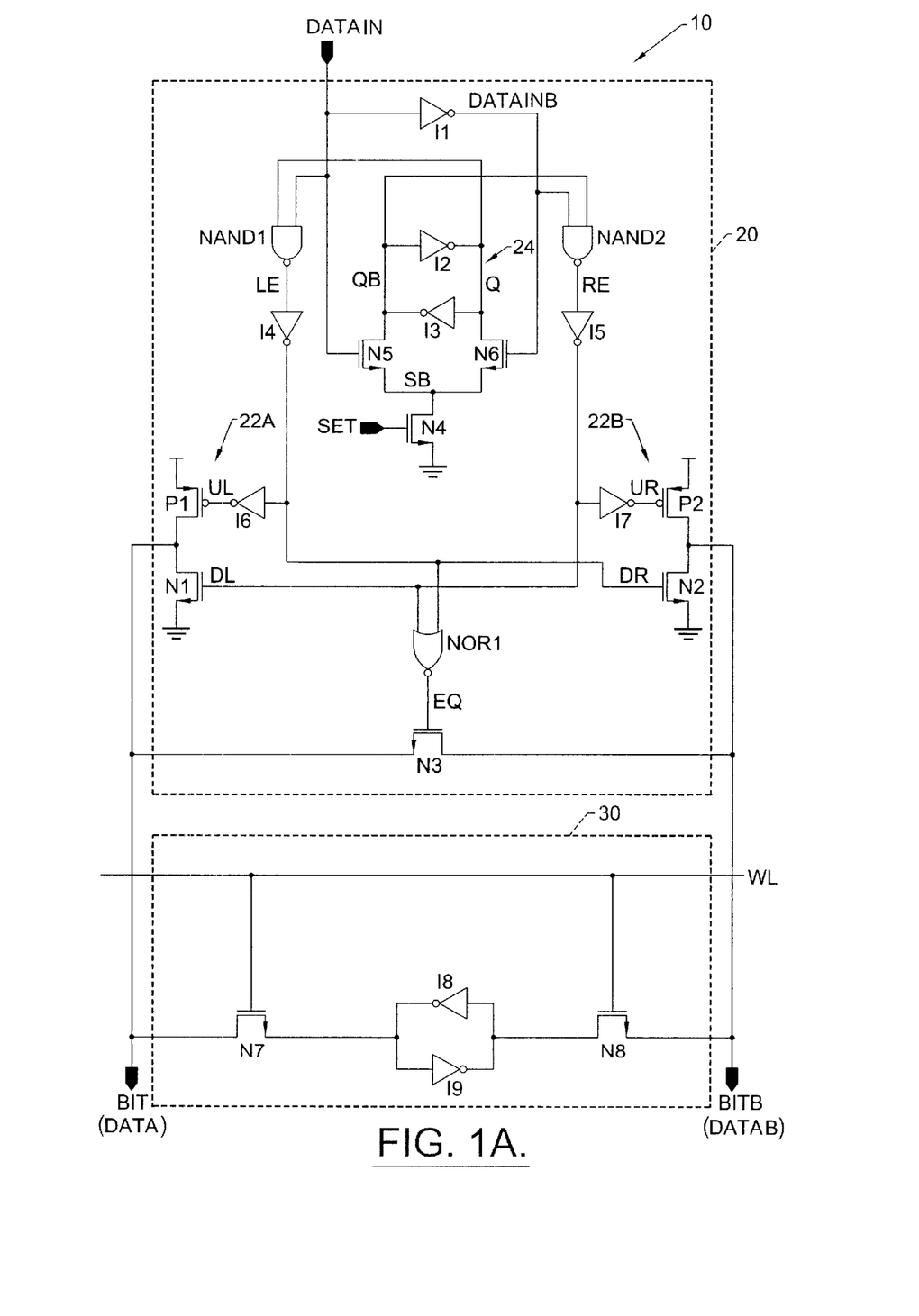
FIG. 1A is an electrical schematic of a static random access memory bit line driver device according to a first embodiment of the present invention.
Figure 3:
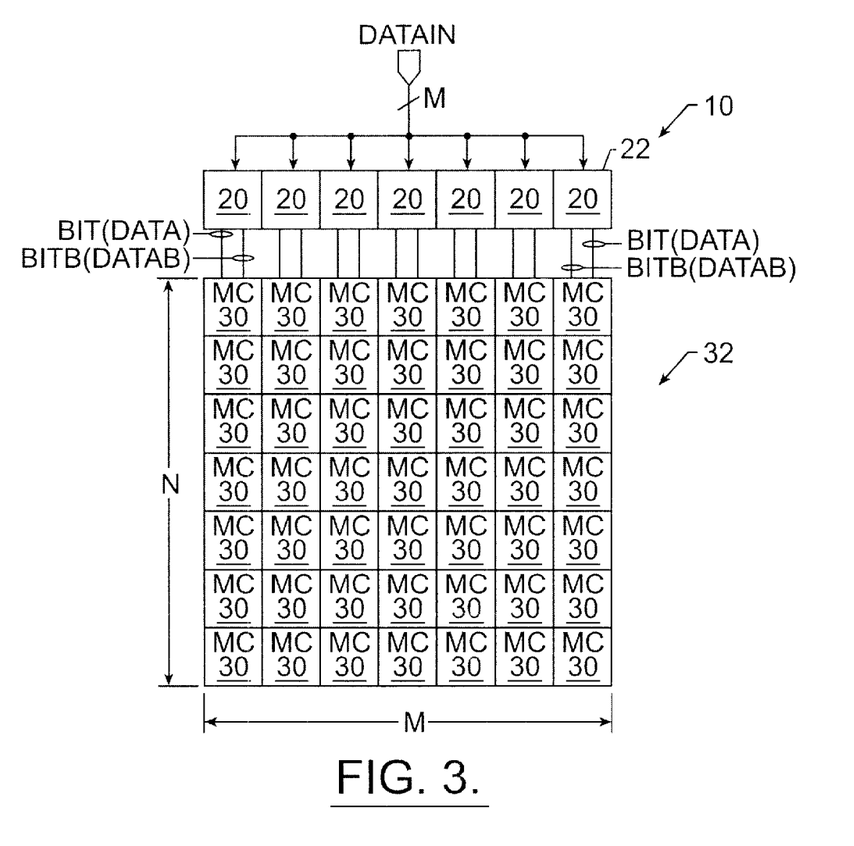
FIG. 3 is a block diagram that illustrates a memory cell array according to an embodiment of the present invention.

Referring now to FIG. 1A, an integrated circuit memory device 10 according to a first embodiment of the present invention includes a preferred complementary data line driver control circuit 20 that is electrically coupled to a memory cell 30 (MC) within a memory cell array 32. The illustrated data line driver control circuit 20, which may constitute a single "cell" within a larger integrated driver control circuit 22, is electrically coupled by a pair of complementary data lines to the memory cell 30. In alternative embodiments, these complementary data lines may contain data to be compared in a CAM cell or may constitute input/output (I/O) lines of a circuit or be any differential data bus in an integrated circuit. In the illustrated memory device 10, the complementary data lines will be referred to as complementary bit lines BIT and BITB (/BIT), where the suffix B (or prefix symbol "/") denotes a complementary signal. As described more fully hereinbelow, the illustrated memory cell 30 constitutes a static random access memory (SRAM) cell. This illustrated SRAM cell 30 may be located in one of a plurality of columns of memory cells within an N×M SRAM array 32, where N designates the number of rows and M designates the number of columns in the array 32. (See, e.g., FIG. 3) The data line driver control circuit 20 conserves power when switching the complementary bit lines by evaluating existing data (i.e., "old" data) on the complementary bit lines and providing charge recycling in the event the new data to be provided to the complementary bit lines differs from the old data residing thereon. Based on the evaluation and a determination that the old data is opposite the new data, the driver control circuit 20 switches the old data to the new data by first transferring charge from the more positively biased one of the first and second bit lines to the other bit line in the bit line pair. In this manner if the true bit line BIT is at a logic 1 voltage and the complementary bit line BITB is at a logic 0 voltage, then at least a portion of the total charge required to pull the complementary bit line BITB up to a logic 1 voltage (and a portion of the total charge required to pull the true bit line down to a logic 0 voltage) during a switching event may be provided by the already fully charged (discharged) true (complementary) bit line BIT (BITB), prior to actively pulling the complementary bit line BITB high and actively pulling the true bit line BIT low with respective data line drivers.

The driver control circuit 20 of FIG. 1A includes a true data line driver 22A and a complementary data line driver 22B. These drivers may be of conventional design. The true data line driver 22A is illustrated as including a first PMOS pull-up transistor P1 and a first NMOS pull-down transistor N1. The first PMOS pull-up transistor P1 has a drain electrically coupled to the true bit line BIT and a source electrically coupled to a power supply line (e.g., Vdd). The first NMOS pull-down transistor N1 has a drain electrically coupled to the true bit line BIT and a source electrically coupled to a reference line (e.g., GND). The complementary data line driver 22B is illustrated as including a second PMOS pull-up transistor P2 and a second NMOS pull-down transistor N2. The second PMOS pull-up transistor P2 has a drain electrically coupled to the complementary bit line BITB and a source electrically coupled to the power supply line. The second NMOS pull-down transistor N2 has a drain electrically coupled to the complementary bit line BITB and a source electrically coupled to the reference line.

The driver control circuit 20 also includes a latch 24 having a true output Q and a complementary output QB. The latch 24, as shown, comprises second and third inverters 12 and 13 that are electrically connected in antiparallel, but can be any convenient device for "remembering" data. The true and complementary outputs Q and QB of the latch 24 are electrically connected connected to a drain of a second NMOS transistor N6 and a drain of a first NMOS transistors N5 within a differential pair, respectively. The sources of the NMOS transistor N5 and N6 within the differential pair are electrically connected together at a common node SB. An enable transistor N4 (shown as NMOS) has a gate that is responsive to a set signal SET, a drain electrically connected to the common node SB and a source electrically connected to the reference line. The gates of the first and second NMOS transistors N5 and N6 within the differential pair are responsive to true input data DATAIN and complementary input data DATAINB signals, as illustrated. The complementary input data DATAINB is generated at an output of a first inverter 11, which receives the true input data DATAIN as an input. Based on this configuration of the latch 24, the differential pair of NMOS transistors N5 and N6 and the enable transistor N4, the receipt of an active high set signal SET at a logic 1 voltage (when the true input data DATAIN is also at a logic 1 voltage) will cause the complementary output QB of the latch 24 to be pulled low, the relatively strong path through NMOS transistor N5 and N6 overpowering the relatively weak PMOS transistor within inverter 13 (and the true output Q to be pulled high) and vice versa when the true input data DATAIN is at a logic 0 voltage. Accordingly, the true output Q of the latch 24 will be driven to the value of the true data DATAIN in response to and in-sync with a rising transition of the set signal SET. Stated alternatively, the true output Q of the latch 24 will retain previously received data (i.e., "old" data) until the rising transition of the set signal SET is received by the enable transistor N4 following a transition of the input data DATAIN to a new data value.

A first two-input NAND gate NAND1 and a fourth inverter 14 generate a right-side down signal DR in response to the true input data DATAIN and the true output Q of the latch 24. Accordingly, the right-side down signal DR will be driven to or held at a logic 1 voltage when and only when DATAIN×Q=1, where "x" represents a boolean AND operator. Similarly, a second two-input NAND gate NAND2 and a fifth inverter 15 generate a left-side down signal DL in response to the complementary input data DATAINB and the complementary output QB of the latch 24. Thus, the left-side down signal DL will be driven to or held at a logic 1 voltage when and only when DATAINB×B=1. A sixth inverter 16 is provided that generates a left-side up signal UL in response to the right-side down signal DR. Likewise, a seventh inverter 17 is provided that generates a right-side up signal UR in response to the left-side down signal DL. Accordingly, whenever the second NMOS pull-down transistor N2 is turned on, the first PMOS pull-up transistor P1 will also be turned on, and whenever the first NMOS pull-down transistor N1 is turned on, the second PMOS pull-up transistor P2 will also be turned on.

The driver control circuit 20 also includes an equalization transistor N3 having a first current carrying terminal electrically connected to the true bit line BIT and a second current carrying terminal electrically connected to the complementary bit line BITB. As illustrated, the equalization transistor may be an NMOS transistor having a gate electrode that is responsive to an equalization signal EQ. This equalization signal EQ is generated by a first two-input NOR gate NOR1. The first NOR gate NOR1 has inputs that receive the right-side down signal DR and the left-side down signal DL. Thus, the equalization signal EQ will be driven to a logic 1 voltage when both NMOS pull-down transistors N1 and N2 are off. Of course, at this time, both PMOS pull-up transistors are also off. That is, the equalization transistor N3 is on only when all the driver transistors N1, N2, P1 and P2 are off. The equalization transistor N3 is on only if DL and DR are both low. For DL to be low, DATAINB or QB (or both) must be low. For DR to be low, DATAIN or Q (or both) must be low. Since Q and QB are complementary, and since DATAIN and DATAINB are complementary, the condition that both DL and DR are low together requires DATAIN to be the complement of Q. That is, the equilibrate signal is active high only when the DATAIN signal (i.e., the new data) differs from the data stored in the latch (i.e., the old data). Accordingly, the first NOR gate NOR1 may be replaced by a two-input exclusive OR gate that receives the true input data DATAIN and true output Q of the latch 24 as inputs or receives the complementary input data DATAINB and the complementary output QB as inputs.

Preferred methods of operating the integrated circuit memory device 10 of FIG. 1A include driving true and complementary bit lines within a complementary bit line pair with first data that causes the true bit line BIT to become (or stay) more positively biased than the complementary bit line BITB. Driving the true and complementary bit lines BIT and BITB with the first data so that BIT=1 and BITB=0 requires pulling the true bit line BIT high and pulling the complementary bit line BITB low. This is achieved by selectively turning on (or holding on) the first PMOS pull-up transistor P1 and the second NMOS pull-down transistor N2 and turning off (or holding off) the first NMOS pull-down transistor N1 and the second PMOS pull-up transistor P2. As described more fully hereinbelow, this turning on of the first PMOS pull-up transistor P1 and second NMOS pull-down transistor N2 may be performed in response to and in-sync with a transition of the active high set signal SET from a logic 0 voltage to a logic 1 voltage (with the true input data DATAIN at a logic 1 voltage). This rising transition of the active high set signal SET causes the enable transistor N4 to turn on and provide a conductive pull-down path between the complementary output of the latch 24 and the reference line. In response, the true output Q of the latch 24 transitions to a logic 1 voltage.

This first data may then be loaded into the illustrated SRAM cell 30 by driving a respective word line WL with an active high word line signal. The transition of the illustrated word line WL from a logic 0 voltage to a logic 1 voltage will cause a pair of access transistors within the SRAM cell 30 to turn on. The pair of access transistors are illustrated as NMOS transistors N7 and N8. In response to turn on of the access transistors, a latch within the SRAM cell 30 will be provided with the differential data residing on the first and second bit lines BIT and BITB. For example, if the SRAM cell 30 is storing an initial or previously loaded logic 0 data value and the first and second bit lines BIT and BITB are at logic 1 and logic 0 voltages, respectively, then a true output of the internal latch comprising the SRAM cell, which is illustrated as comprising inverters 18 and 19, will switch from a logic 0 voltage to a logic 1 voltage. In contrast, if the SRAM cell 30 is storing a logic 1 data value and the first and second bit lines BIT and BITB are at logic 1 and logic 0 voltages, respectively, then a true output of the internal latch will remain unchanged in response to turn on of the access transistors within the SRAM cell 30.

Operations for switching the data on the complementary bit lines from a logic 1 value, which represents "old" data, to a logic 0 value, which represents "new" data, will now be described. These operations commence with switching the true input data line DATAIN from a logic 1 voltage to a logic 0 voltage to represent the new bit of data being received by a respective column within the memory device 10. At this time, the SET signal is off so that latch retains the (old) data. In response, the output of the first inverter 11 will switch from a logic 0 voltage to a logic 1 voltage. In response to the transition on the true input data line DATAIN, the first and second NMOS transistors N5 and N6 within the differential pair will turn off and on, respectively. However, these first and second NMOS transistors N5 and N6 will not change the state of latch 24 so long as the active high set signal SET is maintained at a logic 0 voltage and the enable transistor N4 is thereby turned off. The maintenance of a logic 0 voltage on the active high set signal line SET will also cause latch 24 to hold the prior data value and maintain a logic 1 voltage at the true output Q.

The first NAND gate NAND1, which receives the true output Q of the latch 24 and the true input DATAIN, will switch the left-side enable signal line LE at its output from a logic 0 voltage to a logic 1 voltage. In response, the fourth inverter 14, which receives the left-side enable signal LE at its input, will switch the right-side down signal DR from a logic 1 voltage to a logic 0 voltage and thereby turn-off the second NMOS pull-down transistor N2. Moreover, the sixth inverter 16, which is responsive to the right-side down signal DR, will generate a left-side up signal UL at a logic 1 voltage and thereby turn off the first PMOS pull-up transistor P1. However, the second NAND gate NAND2, which receives the complementary output QB of the latch 24 and the complementary input data DATAINB, will not (yet) switch the right-side enable signal line RE at its output from its previous logic 1 voltage because one of its two inputs, QB, remains at a logic 0 voltage. The fifth inverter 15, which receives the right-side enable signal RE at its input, will continue to output a low signal on DL and thereby continue to hold off the first NMOS pull-down transistor N1. Moreover, the seventh inverter 17, which is responsive to the left-side down signal DL, will continue to generate a right-side up signal UR at a logic 1 voltage and thereby continue to hold off the second PMOS pull-up transistor P2. Thus, changing the true input data DATAIN from a logic 1 value to a logic 0 value will cause each of the pull-up and pull-down transistors within the true and complementary drivers 22A and 22B to remain off or turn off and thereby render the outputs of the true and complementary data line drivers 22A and 22B in high impedance states.

Switching the right-side down signal DR from high to low while the left-side down signal DL remains low in response to transition of the true input data DATAIN from a logic 1 value to a logic 0 value will also cause the first NOR gate NOR1 to switch the equalization signal line EQ from a logic 0 level to a logic 1 level. This switching of the equalization signal line EQ from a logic 0 level to a logic 1 level will cause the equalization transistor N3 to turn on. In response to this turn on of the equalization transistor N3, "recycled" charge will pass from the positively charged capacitance of the true bit line BIT through the equalization transistor N3 to the negatively charged (discharged) capacitance of the complementary bit line BITB. This current will cause the magnitude of the logic 1 voltage on the bit line BIT, which represents the old data residing thereon, to be reduced as the magnitude of the logic 0 voltage on the complementary bit line BITB is increased. The amount of charge Q transferred as a result of this current equals $C\Delta V$, where C represents the capacitance of the true bit line BIT and $\Delta V$ represents the magnitude of the change in voltage on the true bit line BIT that occurs in response to the current. If the initial logic 1 voltage on the true bit line BIT equals Vdd and the initial logic 0 voltage on the complementary bit line BITB equals 0 volts, then the maximum $\Delta V$ that can be achieved in response to turning on the equalization transistor N3 will be ½ Vdd. This maximum $\Delta V$ transfers half the charge necessary (assuming negligible inductance and assuming the capacitance of BIT and BITB are substantially equal) to increase the voltage of the complementary line from 0 volts to Vdd as it simultaneously supplies half the charge necessary to discharge the voltage of the true bit line. The other half of the charge will later be supplied by the power supply Vdd and reference voltage ground when the data line drivers 22A and 22B are enabled. Recycling half the charge cuts the energy consumed by a full 50%. Unfortunately, to achieve most of this level of charge transfer from Vdd to ground, the equalization transistor N3 will need to remain conductive for a relatively long period of time before the true bit line BIT is actively pulled low and complementary bit line BITB is actively pulled high by the true and complementary data line drivers 22A and 22B. Thus, achieving a maximum energy savings when switching old data to new data having a different value may reduce the maximum speed achieved in high performance memory devices.

As the time the equalization transistor remains on increases, the energy per cycle consumed by the circuit decreases but so does the maximum operating frequency. To optimize the speed-power tradeoff in any given application, circuitry (not shown) can be used to control the time delay between application of valid data to the input data line DATA and the switching of the SET signal from low (inactive) to high (active). This rising transition of the set signal SET turns the equalization transistor N3 off by switching the true output Q of the latch 24 to match the value of the new data on the true input data line DATAIN and thereby causing the left-side enable signal LE to switch from high to low if DATAIN=Q=1 or the right-side enable signal RE to switch from high to low if DATAIN=Q=0. In response, either the right-side down signal DR or the left-side down signal DL will switch from low to high and cause the first NOR gate NOR1 to pull the equalization signal line EQ low and turn off the equalization transistor N3. Thus, if the new input DATAIN=0, then the rising transition of the set signal SET will trigger the left-side down signal DL to switch from low to high and turn on the second PMOS pull-up transistor P2 in the complementary data line driver 22B and the first NMOS pull-down transistor N1 in the true data line driver 22A. This triggering event will cause the true data line driver 22A to actively pull the true bit line BIT low to 0 volts and the complementary data line driver 22B to actively pull the complementary bit line BITB high to Vdd. Alternatively, if the new input DATAIN=1 and the old data existing on the true bit line BIT is at a logic 0 voltage, then the rising transition of the set signal SET will trigger the right-side down signal DR to switch from low to high and turn on the first PMOS pull-up transistor P1 in the true data line driver 22A and the second NMOS pull-down transistor N2 in the complementary data line driver 22B.

The active high set signal SET may be generated by a pulse generator that is triggered in-sync with the application of valid input data DATAIN. In particular, the time interval between the application of new data to the input data line DATAIN (turning off all drivers 22A and 22B and turning on the equalization transistor N3 if and only if the new data is opposite the old data) and the rising edge of the active high set signal SET (turning off the equalization transistor N3 and turning on drivers 22A and 22B with new data) may be selected to achieve a desired degree of charge transfer from the true bit line BIT to the complementary bit line BITB in the event old data equals 1 and new data equals 0 or vice versa in the event old data equals 0 and new data equals 1, while still maintaining a sufficiently high switching speed. The tradeoff between higher switching speed and higher power savings can be chosen at different points depending upon a desired application and power consumption requirements. For example, a preferred timing of SET relative to receipt of new data to achieve significant power consumption savings with little sacrifice in performance can be chosen so that the quantity of charge Q transferred between the true and complementary bit lines BIT and BITB is $0.3CV_{data}$, where $V_{data}$ is a voltage of the more positively biased one of the true and complementary bit lines relative to the other at a commencement of transferring the charge Q. For greater power savings with more sacrifice in speed performance, a timing of SET relative to receipt of new data can be chosen so that the voltages on the true and complementary bit lines BIT and BITB are substantially equilibrated to within about $0.1V_{data}$.

Finally, in the event the new data on the input data line DATAIN and the old data residing on the true bit line BIT are the same, the true and complementary data line drivers 22A and 22B will continue to drive the true and complementary bit lines BIT and BITB with the old data (which becomes the new data) without interruption and without turn on the equalization transistor N3. This continuous driving condition is achieved because the voltages on the right-side down signal line DR and the left-side down signal line DL, which are unequal to each other, do not change upon application of new data that equals the old data and do not cause the first NOR gate NOR1 to generate a logic 1 on equalization signal line EQ. Likewise, these signals do not change when SET is enabled as the latch 24 does not change.

Figure 1B:
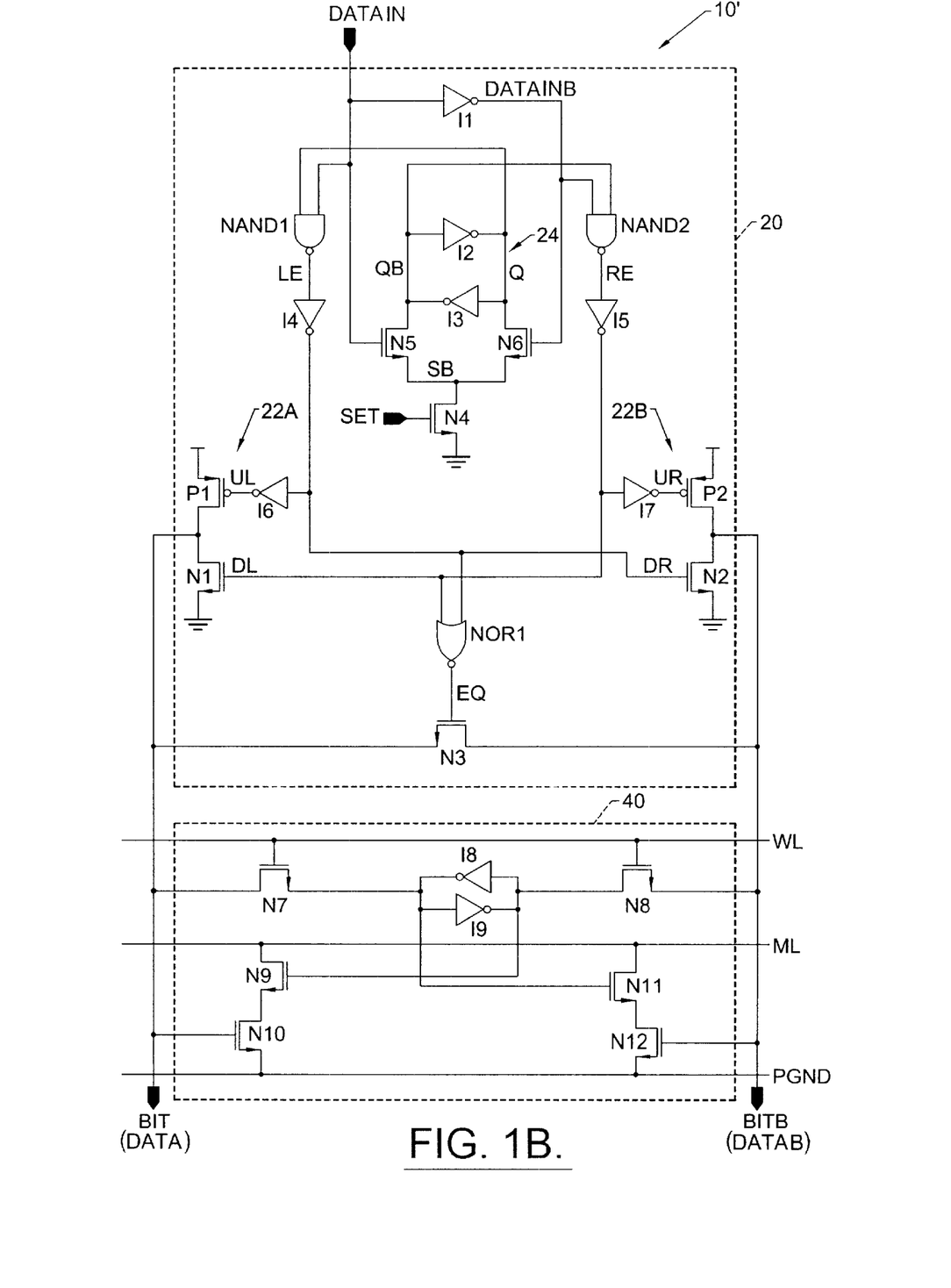
FIG. 1B is an electrical schematic of a content addressable memory bit line driver device according to a second embodiment of the present invention.

Referring now to FIG. 1B, an integrated circuit memory device 10' according to a second embodiment of the present invention includes a preferred complementary data line driver control circuit 20, which operates as described above with respect to FIG. 1A, and a content-addressable memory (CAM) cell 40 within a CAM array. In this embodiment, the receipt of rising word line signal WL by the illustrated CAM cell 40 will turn on the pair of access transistors N7 and N8 and load the latch defined by the pair of inverters 18 and 19 with the data residing on the corresponding pair of complementary bit lines BIT and BITB. During a look-up or search operation, the data on the complementary bit lines BIT and BITB (or separate complementary data lines in some CAM cells) can be compared with the data on the latch within a respective CAM cell 40 by precharging the match line ML and the corresponding pseudo-ground line PGND to a logic 1 voltage and then pulling the corresponding pseudo-ground line PGND low to a logic 0 voltage once valid data is present on the complementary bit lines BIT and BITB. If a mismatch is present between the data on the complementary bit lines BIT and BITB and the data stored within the CAM cell 40, the match line ML will be pulled low to the potential of the pseudo-ground line by the true serial path defined by NMOS transistors N9 and N10 or the complementary serial path defined by NMOS transistors N11 and N12. Conventional techniques can be used to detect a transition of the match line ML from a precharged logic 1 voltage to a logic 0 voltage and indicate a mismatch condition. The power savings associated with the charge recycling described in this patent are particularly important in a CAM because many, most, or perhaps all the bit lines to the memory device are driven with new complementary data each search cycle and the power consumption and its related heat generation are major problems.

The requirements of conventional compare operations in a CAM array may include providing masked data to a pair of complementary bit lines BIT and BITB. This masked data may be applied by driving both of the complementary bit lines BIT and BITB to logic 0 levels. If either the previous data was masked or the new data is masked, the above described charge transferring operations may not provide a power saving advantage since there is no charge recycling available, but unnecessary charge may be consumed by, among other things, turning on the equalization transistor N3. The driver control circuit 20 of FIG. 1B may be modified to facilitate a masked compare operation by driving both bit lines within a complementary pair to logic 0 levels. For example, as illustrated by the integrated circuit memory device 10" of FIG. 1D, a driver control circuit 20' may be provided that receives an active low complementary mask signal (shown as /MASK). This driver control circuit 20' is similar to the driver control circuit 20 of FIG. 1B, however, inverters 14–17 have been replaced by two-input NAND gates (shown as NAND3–NAND6). The NAND gates each have one input responsive to the active low complementary mask signal (/MASK), as illustrated. When the active low mask signal /MASK is set to a logic 1 voltage, the operation of the driver control circuit 20' is identical to the driver control circuit 20 of FIG. 1B. However, when the active low complementary mask signal /MASK is set to a logic 0 voltage, signal lines UL, DL, UR and DR are all pulled high and the true and complementary bit lines BIT and BITB are both pulled low to enable a masking operation to be performed on the illustrated CAM cell 40 (by holding off NMOS transistor N10 and NMOS transistor N12 during a compare operation within each CAM cell in a respective column of CAM cells). A very small power benefit may result from disabling the charge transfer step if either the old data or the new data is masked. This disabling occurs with the circuit illustrated in FIG. 1D when the new data is masked. In this case, the signal lines DR and DL are driven high by NAND gates NAND3 and NAND4 upon receipt of the new active low complementary mask signal /MASK. In response to the signal lines DR and DL being driven high, the output of NOR gate NOR1 is pulled low to thereby hold the equalization transistor N3 in an off state, saving a small amount of power that would otherwise be associated with turning the equalization transistor N3 on and then off.

Figure 1C:
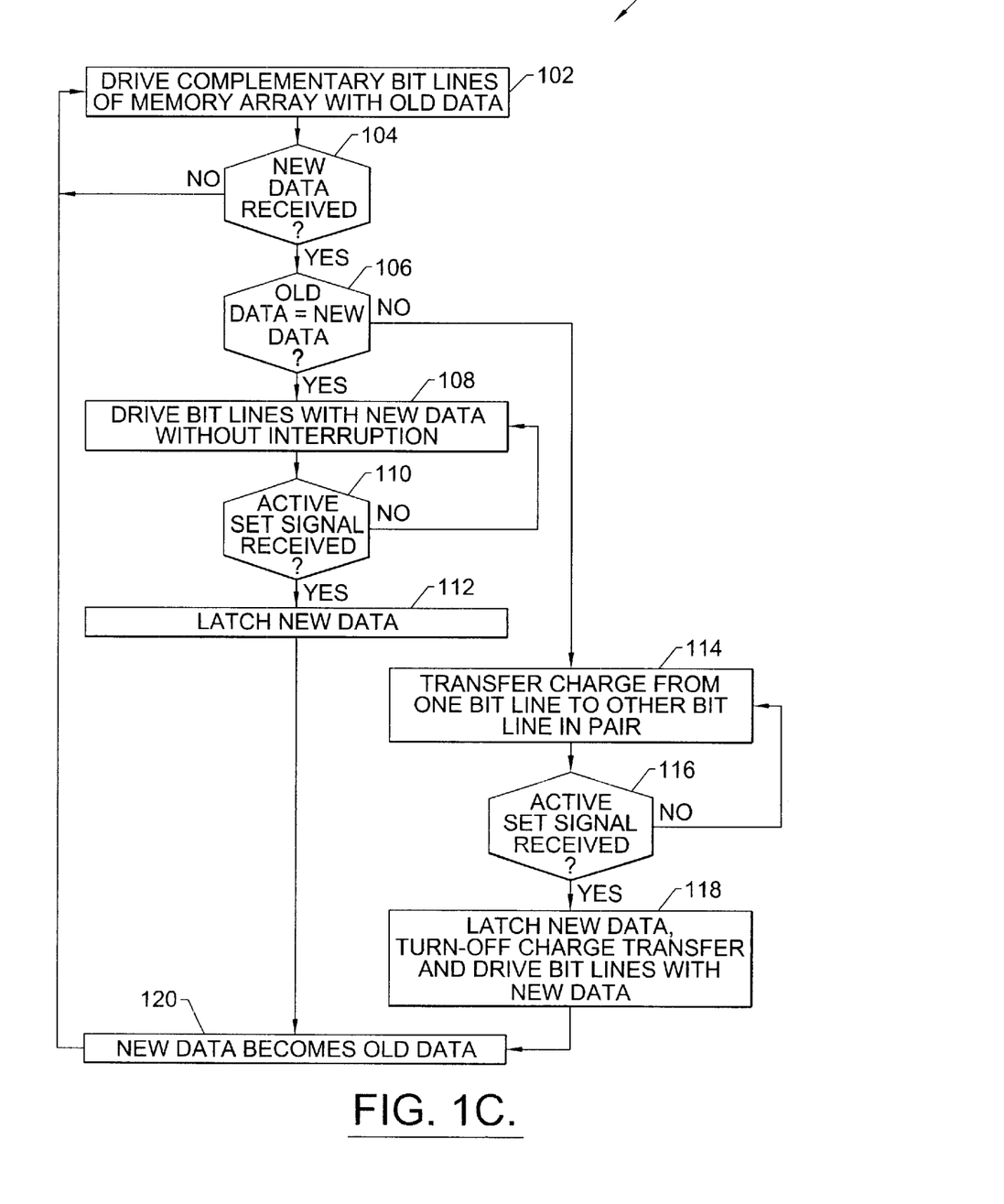
FIG. 1C is a flow diagram of operations that illustrates methods of operating memory devices according to embodiments of the present invention.
Figure 1D:
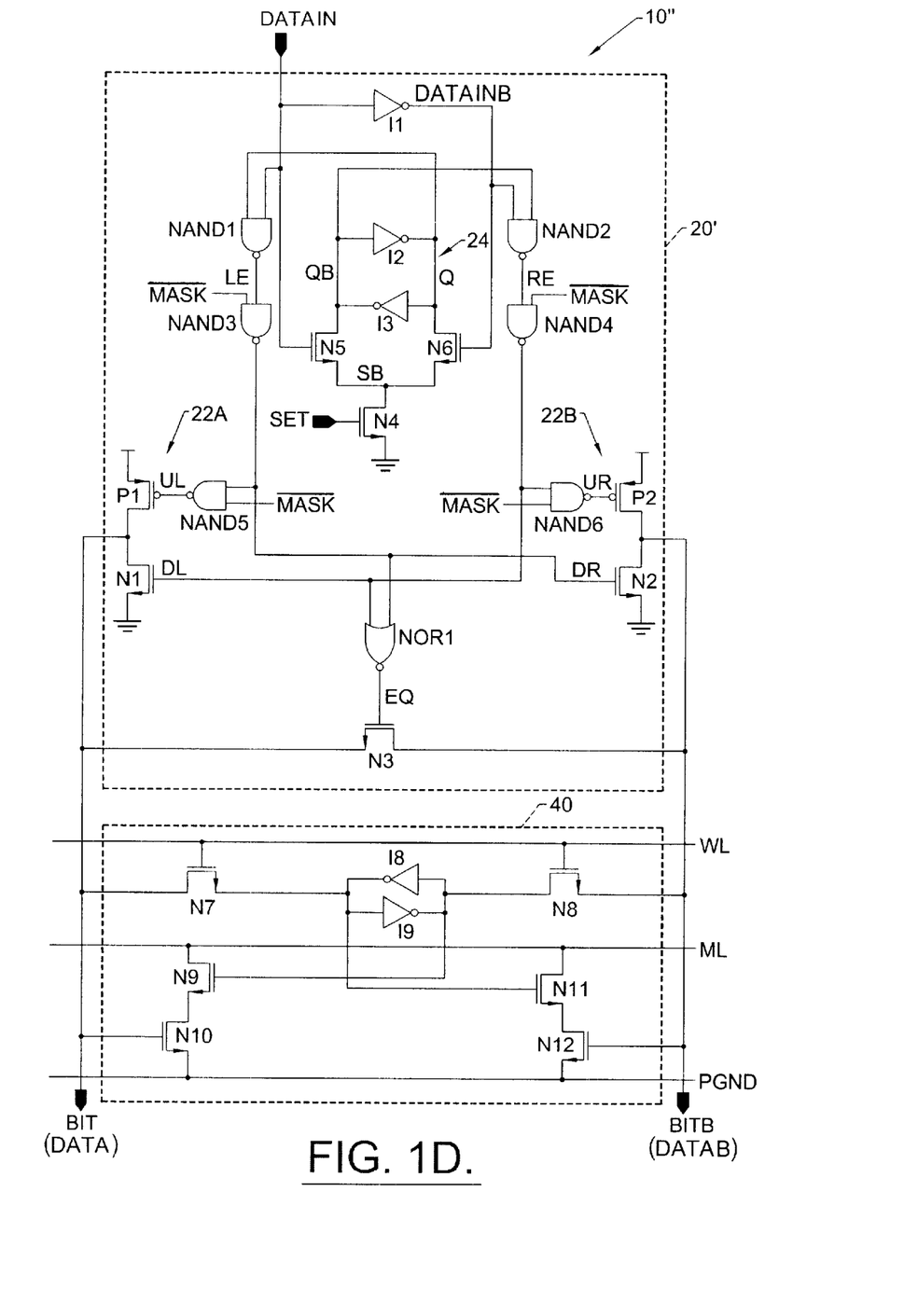
FIG. 1D is an electrical schematic of a content addressable memory bit line driver device according to a third embodiment of the present invention.

Referring now to FIG. 1C, a flow diagram that illustrates operations 100 performed by the memory devices 10 and 10' of FIGS. 1A–1B will be described. These operations include using a pair of complementary data line drivers to drive a pair of complementary bit lines with data, Block 102. Upon receipt of new input data, Block 104, an evaluation is made as to whether the new input data is equal to the "old" data residing on the complementary bit lines, Block 106. If the new data is equal to the old data, then the complementary bit lines are driven continuously with the old data which then becomes new data without interruption. For example, if the true bit line BIT is high and the complementary bit line BITB is low and the new input data DATAIN is a logic 1 value, then the true and complementary bit lines will continue to be held high and low, respectively, without interruption. Then, upon receipt of an active set signal (i.e., SET=1), Block 110, the new data may be latched, Block 112. As described above with respect to FIGS. 1A–1B, the true and complementary outputs Q and QB of the latch will remain unchanged in response to an active set signal if the new data equals the old data. As illustrated by Block 120, the new data is then treated as the old data and operations return to Block 102.

Referring again to Block 106, if the new data and old data are opposite, then charge will be transferred from one bit line in the pair to the other bit line in the pair. For example, if the old data on the true bit line is a logic 1 value and the new data to be loaded is a logic 0 value, then, as illustrated by Block 114, charge will be transferred from the true bit line to the complementary bit line. For maximum power savings at the expense of lower speed, this charge transfer preferably continues until the voltages on the true and complementary bit lines are substantially equilibrated. Then, in response to an active set signal, Block 116, the new data is latched, the charge transfer is turned off and the bit lines are actively driven with the new data, Block 118. The latching of the new data, the turn off of the charge transfer and the driving of the bit lines with the new data may be performed in-sync with a rising edge of an active high set signal. The duration of the time interval between the application of the new input data and the rising edge of the active high set signal can be controlled by a designer to achieve a desired degree of charge recycling and switching speed. Control is then passed to Block 120.

Figure 2:
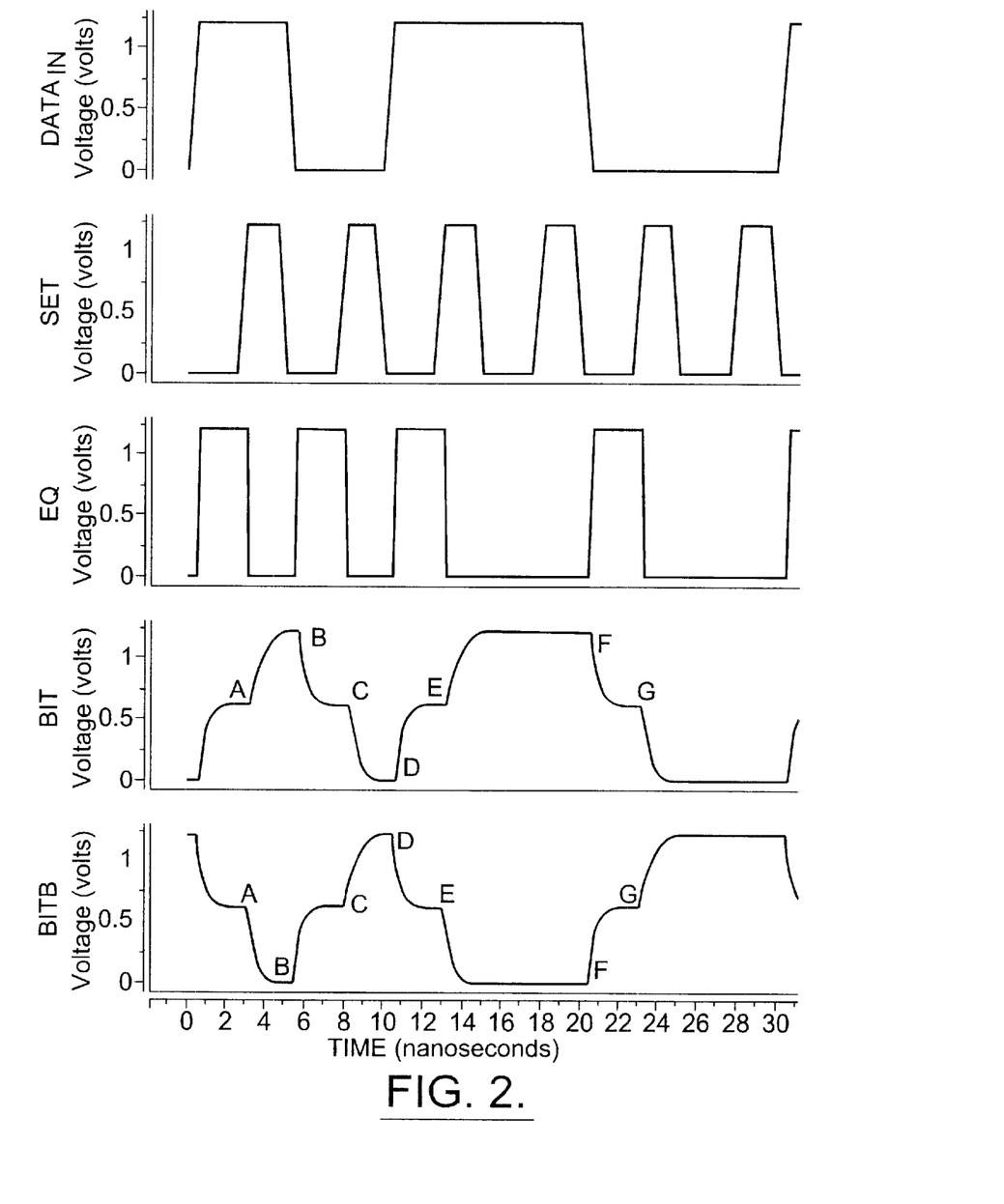
FIG. 2 is a timing diagram that illustrates simulated operation of the driver control circuits of FIGS. 1A and 1B.

Referring now to FIG. 2, a simulated timing diagram illustrating operation of driver control circuit 20 of FIGS. 1A–1B will be described. This simulation diagram is provided solely for the purpose of illustrating general operation of the device embodiments of FIGS. 1A and 1B and the specific voltages, timing and waveform characteristics illustrated by the timing diagram are not to be used in any way to limit the scope of the invention as defined by the claims. The timing diagram provides simulated waveforms for the following computer generated input signals (DATAIN and SET) as well as the resulting output signals (EQ, BIT and BITB) obtained by transient analysis of section 20 of FIGS. 1A and 1B. In this simulation, the power supply voltage is 1.20 Volts.

With the following initial conditions: DATAIN=0, SET=0, EQ=0, BIT=0, BITB=1 and Q=0 (not shown) at t=0 ns, a rising transition on the input data line DATAIN will turn off bit line drivers 22A and 22B and will generate a rising transition on the equalization signal line EQ and turn on the equalization transistor N3 connecting the true bit line BIT to the complementary bit line BITB. In response to the turn on of the equalization transistor N3, charge will be transferred from the complementary bit line BITB to the true bit line BIT. At approximately 3 ns, the voltage on the true and complementary bit lines will be substantially equilibrated at respective levels illustrated by points A. The active high set signal SET then undergoes a rising transition commencing at about 3 ns. In response, the latch within the driver control circuit is reset to reflect the new input data. As a result, the equalization transistor is turned off and the true and complementary data line driver devices are turned on to actively drive the true and complementary bit lines BIT and BITB with the new data. As illustrated by FIG. 2, a full logic 1 voltage is established on the true bit line BIT and a full logic 0 voltage is established on the complementary bit line BITB in the interval between about 5–6 ns, as shown by points B. The delay between the initial transition of the input data DATAIN from low to high at about 0 ns and the establishment of a full logic 1 voltage on the true bit line BIT at about 5–6 ns is greater than the delay that would be expected if the transition of the input data immediately triggered the switching of the true and complementary bit line drivers, without providing an interim period which allows for charge transfer. However, under this scenario, higher speed may be achieved, but at the expense of higher power consumption. The balance between these two competing goals of high speed and low power can be chosen by the circuit designer by, among other things, setting the delay between the transition of new data DATAIN and the assertion of a rising transition of the set signal SET.

Referring again to FIG. 2, the input data DATAIN is then switched from high to low and this transition turns off bit line drivers 22A and 22B and generates a rising edge of the equalization signal EQ because the now "new" data is unequal to the now "old" data stored by the latch and currently residing on the bit lines. A rising edge of the equalization signal EQ turns on the equalization transistor N3 and initiates charge transfer from the more positively biased true bit line BIT to the complementary bit line BITB. As illustrated, the delay between the application of the new input data in the interval between about 5–6 ns and a subsequent rising transition of the set signal SET in the interval between about 7–8 ns is sufficient to allow the voltages on the true and complementary bit lines BIT and BITB to become substantially equilibrated at points C. Nonetheless, the rising transition of the set signal SET causes the true output Q of the latch within the driver control circuit to switch from 1 to 0 and this transition triggers turn off of the equalization transistor N3 and termination of charge transfer between the true and complementary bit lines. Switching the output of the latch from 1 to 0 to reflect the new input data also triggers turn on of the true and complementary data line driver devices, which then operate to pull the true bit line BIT down from the substantially equilibrated level at point C to a logic 0 voltage at point D and pull the complementary bit line BITB up from the level at point C to a full logic 1 voltage at point D.

The receipt of new input data DATAIN at about 10 ns results again in the transfer of charge from the complementary bit line BITB to the true bit line BIT because the new input data is unequal to the now old data residing on the bit lines. Accordingly, as illustrated by points E, the voltages on the true and complementary bit lines are again substantially equilibrated. Then, in response to a rising transition of the set signal SET in the interval between about 12–13 ns, the true bit line BIT is pulled up to a full logic 1 voltage and the complementary bit line BITB is pulled down to a logic 0 voltage.

Next, as illustrated by the time interval between about 15 ns and 20 ns, the continued assertion of the same logic 1 input data will not trigger another charge sharing event in the time period leading up the reassertion of the set signal SET in the time interval between about 17–18 ns. All nodes in block 20 of FIG. 1A or 1B remain at their previous value except for the set signal SET itself. Transistors P1 and N2 remain on. However, the falling transition of the input data DATAIN at about 20 ns will trigger a rising transition of the equalization signal line EQ and the commencement of charge sharing in-sync with the rising transition of the equalization signal line EQ at points F. At points G, the voltages on the true and complementary bit lines are once again substantially equilibrated. The reassertion of the rising transition of the set signal SET in the interval between about 22–23 ns will once again trigger the true and complementary data line drivers to turn on and complete the switching of the complementary bit lines. Finally, in the time interval between about 25 ns and 30 ns, the continued assertion of the same logic 0 input data will not trigger another charge sharing event in the time period leading up the reassertion of the set signal SET in the time interval between about 27–28 ns.

Of particular note, when a BIT (BITB) line switches form low to high, approximately half the charge required to raise its voltage from a logic 0 level to a logic 1 level comes from charge recycling from its complementary bit line BITB (BIT), bringing the BIT (BITB) voltage midway between the logic 0 and logic 1 levels. The remaining half of the charge comes directly from the power supply. Thus, this circuit reduces power consumption in switching complementary signals by almost 50%.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A complementary data line driver circuit, comprising:
    first and second data lines within a complementary data line pair; and
    a driver control circuit that is electrically coupled to said data line pair and is configured to perform an evaluation of old data on said data line pair relative to new data to be provided to said data line pair and is further configured to response to the evaluation by switching the old data to the new data when the new data is opposite the old data by first transferring charge from a more positively biased one of said first and second data lines to the other data line in said data line pair and then driving the first and second data lines with the new data.

2. The driver circuit of claim 1, wherein based on the evaluation said driver control circuit switches the old data to the new data by first transferring charge for a duration sufficient to substantially equilibrate voltages on the first and second data lines and then driving the first and second data lines with the new data.

3. The driver circuit of claim 1, wherein in the event the old data and new data are the same, said driver control circuit drives the first and second data lines with the old data and then the new data without transferring charge from the more positively biased one of said first and second data lines retaining the old data to the other data line in said data line pair.

4. The driver circuit of claim 1, wherein the evaluation is made internal to said driver control circuit.

5. The driver circuit of claim 1, wherein said driver control circuit comprises an equalization transistor having a first current carrying terminal electrically coupled to said first data line and a second current carrying terminal electrically coupled to said second data line; and wherein said driver control circuit is configured to respond to the evaluation by driving a gate of said equalization transistor with a turn-on voltage when transferring charge from the more positively biased one of said first and second data lines to the other data line in said data line pair.

6. The driver circuit of claim 1, wherein said driver control circuit comprises a latch that retains the old data while the charge is being transferred from the more positively biased one of said first and second data lines to the other data line in said data line pair.

7. The driver circuit of claim 6, wherein during the evaluation said driver control circuit compares the old data retained by the latch to the new data using boolean logic.

8. The driver circuit of claim 7, wherein said driver control circuit replaces the old data on the latch with the new data at about the same time the first and second data lines are driven with the new data.

9. The driver circuit of claim 8, wherein driving the first and second data lines with the new data is performed in-sync with switching the old data retained by the latch to the new data.

10. The driver circuit of claim 9, wherein a transition of the old data retained by the latch to the new data triggers driving the first and second data lines with the new data.

11. The driver circuit of claim 6, wherein said driver control circuit compares the old data retained by the latch to the new data before transferring charge from the more positively biased one of said first and second data lines to the other data line in said data line pair.

12. The driver circuit of claim 1, wherein said driver control circuit comprises:
   first and second NMOS transistors within a differential pair having sources that are electrically connected together and gates that are electrically connected to a complementary pair of input signal lines that receive the new data; and
   a latch having true and complementary outputs that are electrically connected to the drain of said first NMOS transistor and the drain of the second NMOS transistor, respectively.

13. The driver circuit of claim 1, wherein said driver control circuit comprises:
   a latch that retains the old data; and
   a true data line driver device having a first output electrically connected to said first data line and a PMOS pull-up transistor having a drain electrically connected to the first output and a gate that receives a first active low signal equal to DATAB+QB, where DATA and DATAB are complementary signals that represent the new data, Q and QB are complementary signals that represent the old data retained by the latch, and + designates an OR operator.

14. The driver circuit of claim 13, wherein said driver control circuit comprises:
   a complementary data line driver device having a second output electrically connected to said second data line and a PMOS pull-up transistor having a drain electrically connected to the second output and a gate that receives a second active low signal equal to DATA+Q.

15. The driver circuit of claim 14, wherein said true data line driver device comprises an NMOS pull-down transistor having a drain electrically connected to the first output and a gate that receives a first active high signal equal to DATAB×QB, where × designates an AND operator; and wherein said complementary data line driver device comprises an NMOS pull-down transistor having a drain electrically connected to the second output and a gate that receives a second active high signal equal to DATA×Q.

16. The driver circuit of claim 5, wherein the equalization transistor comprises an NMOS transistor.

17. The driver circuit of claim 16, wherein the gate of said equalization transistor receives a signal equal to (DATA⊕Q), where DATA represents the new data, Q represents the old data retained by the latch and ⊕ designates an exclusive OR operator.

18. The driver circuit of claim 5, wherein said driver control circuit comprises:
   a latch that retains the old data;
   a true data line driver device having a first output electrically connected to said first data line and a PMOS pull-up transistor having a drain electrically connected to the first output and a gate that receives a first active low signal equal to DATAB+QB, where DATA and DATAB are complementary signals that represent the new data, Q and QB are complementary signals that represent the old data retained by the latch, and + designates an OR operator; and
   a complementary data line driver device having a second output electrically connected to said second data line and a PMOS pull-up transistor having a drain electrically connected to the second output and a gate that receives a second active low signal equal to DATA+Q.

19. The driver circuit of claim 18, wherein said first data line driver device comprises an NMOS pull-down transistor having a drain electrically connected to the true output and a gate that receives a first active high signal equal to DATAB×QB, where × designates an AND operator; and wherein said complementary data line driver device comprises an NMOS pull-down transistor having a drain electrically connected to the second output and a gate that receives a second active high signal equal to DATA×Q.

20. The driver circuit of claim 19, wherein said equalization transistor is conductive only when the NMOS pull-down transistors and PMOS pull-up transistors in said true and complementary data line driver devices are nonconductive.

21. A complementary data line driver circuit, comprising:
   first and second data lines within a complementary data line pair; and
   a driver control circuit that is electrically coupled to said data line pair and is configured to perform an evaluation of old data on said data line pair relative to new data to be provided to said data line pair and is further configured to respond to the evaluation by switching the old data to the new data when the new data is opposite the old data by first transferring a quantity of charge Q that is greater than about $0.15 CV_{data}$ from a more positively biased one of said first and second data lines to the other data line in said data line pair, where C is a capacitance of the more positively biased one of said first and second data lines and $V_{data}$ is a voltage of the more positively biased one of s aid first and second data lines relative to the other one said first and second data lines at a commencement of switching the old data to the new data.

22. The driver circuit of claim 21, wherein in the event the old data and new data are the same, said driver control circuit drives the first and second data lines with the old data and then the new data without first transferring any charge from the more positively biased one of said first and second data lines retaining the old data to the other data line in said data line pair.

23. The driver circuit of claim 21, wherein in the event the old data and new data are the same, said driver control circuit drives the first and second data lines with the old data and then the new data without interruption.

24. A complementary data line driver circuit, comprising:
   first and second data lines within a complementary data line pair; and
   a driver control circuit that is electrically coupled to said data line pair and is configured to perform an evaluation of old data on said data line pair relative to new data to be provided to said data line pair and is further configured to respond to the evaluation by switching the old data to the new data when the new data is opposite the old data by first transferring charge from a more positively biased one of said first and second data lines to the other data line in said data line pair during a first time interval and then driving the first and second data lines with the new data during second time interval.

25. The driver circuit of claim 24, wherein in the event the old data and new data are the same, said driver control circuit drives the first and second data lines with the old data and then the new data without first transferring any charge from the more positively biased one of said first and second data lines to the other data line in said data line pair.

26. The driver circuit of claim 25, wherein in the event the old data and new data are the same, said driver control circuit drives the first and second data lines with the old data and then the new data without interruption.

27. The driver circuit of claim 25, wherein a duration of the first time interval is of sufficient length to equilibrate voltages on the first and second data lines to within about $0.2V_{data}$, where $V_{data}$ is a voltage of the more positively biased one of said first and second data lines relative to the other one of said first and second data lines at a commencement of the first time interval.

28. The driver circuit of claim 24, wherein said driver control circuit comprises a latch that retains the old data and is responsive to a set signal; and wherein said driver control circuit is configured to switch the old data retained by the latch to the new data in-sync with a leading edge of the set signal.

29. The driver circuit of claim 28, wherein the duration of the first time interval is about equal to a duration of an interval between a leading edge of the new data to be provided to said data line pair and the leading edge of the set signal.

30. The driver circuit of claim 29, wherein said driver control circuit comprises an equalization transistor having a first current carrying terminal electrically coupled to said first data line and a second current carrying terminal electrically coupled to said second data line; and wherein said driver control circuit is configured to drive a gate of said equalization transistor with a turn-on voltage during the first time interval and a turn-off voltage during the second time interval.

31. A complementary data line driver circuit, comprising:
   first and second data lines within a complementary data line pair; and
   means for comparing old data on said data line pair to new data to be provided to said data line pair and, in response to the comparing, switching the old data to the new data when the new data is opposite the old data by first transferring charge from a more positively biased one of said first and second data lines to the other data line in said data line pair during a first time interval and then driving the first and second data lines with the new data during a second time interval.

32. The driver circuit of claim 31, wherein in the event the old data and new data are the same, said means for comparing and switching drives the first and second data lines with the old data and then the new data without first transferring any charge from the more positively biased one of said first and second data lines to the other data line in said data line pair.

33. A complementary data line driver circuit, comprising:
   first and second data lines within a complementary data line pair;
   a true data line driver device comprising a first PMOS transistor and first NMOS transistor arranged as a totem pole between a power supply line and a reference line and connected together at a first output that is electrically connected to the first data line;
   a complementary data line driver device comprising a second PMOS transistor and second NMOS transistor arranged as a totem pole between the power supply line and the reference line and connected together at a second output that is electrically connected to the second data line;
   an equalization transistor having a first current carrying terminal electrically coupled to said first data line and a second current carrying terminal electrically coupled to said second data line; and
   a control circuit that in response to complementary signals DATA and DATAB that represent new data to be provided to said data line pair, switches old data on said data line pair to the new data by:
      driving a gate of the first PMOS transistor with a signal equal to DATAB+QB;
      driving a gate of the second PMOS transistor with a signal equal to DATA+Q;
      driving a gate of the first NMOS transistor with a signal equal to DATAB×QB;
      driving a gate of the second NMOS transistor with a signal equal to DATA×Q; and
      driving a gate of said equalization transistor with a signal equal to (DATA⊕Q),
   where Q and QB are complementary signals that represent the old data, + designates an OR operator, × designates a AND operator and ⊕ designates an exclusive OR operator.

34. The driver circuit of claim 33, wherein said control circuit is responsive to a set signal and comprises a latch that retains signals Q and QB.

35. The driver circuit of claim 34, wherein in the event the old data and the new data are different, said control circuit switches the values of Q and QB retained by the latch to match the new data in-sync with a leading or trailing edge of the set signal.

36. An integrated circuit memory device, comprising:
   an array of data storage cells arranged as a plurality of rows of data storage cells and a plurality of columns of data storage cells;
   a plurality of pairs of complementary bit lines electrically coupled to the plurality of columns of data storage cells; and
   a bit line driver control circuit that is electrically coupled to said plurality of pairs of complementary bit lines, said bit line driver control circuit comprising a bit line driver control cell that is electrically coupled to first and second bit lines within one of said plurality of pairs of complementary bit lines, said bit line driver control cell configured to perform an evaluation of old data on the first and second bit lines relative to new data to be provided to the first and second bit lines and is further configured to respond to the evaluation by switching the old data to the new data when the new data is opposite the old data by first transferring charge from a more positively biased one of the first and second bit lines to the other bit line in the bit line pair and then driving the first and second bit lines with the new data.

37. The memory device of claim 36, wherein based on the evaluation said bit line driver control circuit switches the old data to the new data by first transferring charge for a duration sufficient to substantially equilibrate voltages on the first and second bit lines and then driving the first and second bit lines with the new data.

38. The memory device of claim 36, wherein said array of data storage cells comprise static random access memory cells.

39. The memory device of claim 36, wherein said array of data storage cells comprise content addressable memory cells.

40. The memory device of claim 39, wherein said plurality of pairs of complementary bit lines are the lines that carry lookup data for the content addressable memory cells.

41. A method of driving complementary data lines, comprising the steps of:

comparing old data on a data line pair to new data to be provided to the data line pair and then based on the comparing, either switching the old data to the new data when the new data is opposite the old data by first transferring charge from a more positively biased one of the first and second data lines to the other data line in the data line pair and then driving the first and second data lines with the new data, or in the event the new data and old data are the same, then driving the first and second data lines with the old data and then the new data without transferring charge from the more positively biased one of the first and second data lines to the other data line in the data line pair.

42. The method of claim 41, wherein the data lines in the data line pair are electrically coupled together by an equalization transistor; and wherein transferring charge from a more positively biased one of the first and second data lines to the other data line in the data line pair comprises passing the charge through the equalization transistor.

43. A content addressable memory device, comprising:

first and second data lines within a complementary data line pair; and a driver control circuit that is electrically coupled to said data line pair and is configured to perform an evaluation of old data on said data line pair relative to new data to be provided to said data line pair during a second unmasked compare operation that immediately follows a first unmasked compare operation and is further configured to respond to the evaluation by switching the old data to the new data when the new data is opposite the old data by first transferring charge from a more positively biased one of said first and second data lines to the other data line in said data line pair and then driving the first and second data lines with the new data.

44. The memory device of claim 43, wherein said driver control circuit is further configured to switch masked or unmasked old data to masked new data without first transferring charge from a more positively biased one of said first and second data lines to the other data line in said data line pair.

45. The memory device of claim 43, wherein said driver control circuit is further configured to switch masked old data to masked or unmasked new data without first transferring charge from a more positively biased one of said first and second data lines to the other data line in said data line pair.

46. A content addressable memory device, comprising:

true and complementary data lines within a complementary data line pair;

a CAM cell electrically coupled to said true and complementary data lines; and a driver control circuit that is electrically coupled to said complementary data line pair and is configured to perform a comparison of unmasked old data on said true and complementary data lines and unmasked new data to be provided to said true and complementary data lines and is further configured to respond to the comparison by either:

first transferring charge between said true and complementary data lines and then driving said true and complementary data lines with the unmasked new data, in the event the unmasked old data and the unmasked new data are opposite, or driving said true and complementary data lines with the unmasked old data and then the unmasked new data without interruption by transferring charge between said true and complementary data lines, in the event the unmasked old data and the unmasked new data are equivalent.

* * * * *

UNITED STATES PATENT AND TRADEMARK OFFICE
CERTIFICATE OF CORRECTION

PATENT NO. : 6,549,042 B2
DATED : April 15, 2003
INVENTOR(S) : Robert J. Proebsting

It is certified that error appears in the above-identified patent and that said Letters Patent is hereby corrected as shown below:

Column 6,
Line 51, change "true data" to -- true input data --.

Column 7,
Line 2, change "DATAINBxB=1" to -- DATAINBxQB=1 --.

Signed and Sealed this

Twelfth Day of August, 2003

JAMES E. ROGAN
*Director of the United States Patent and Trademark Office*